US008610508B2

(12) United States Patent
Sornin

(10) Patent No.: US 8,610,508 B2
(45) Date of Patent: Dec. 17, 2013

(54) INJECTION-LOCKED OSCILLATOR

(75) Inventor: Nicolas Sornin, La Tronche (FR)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/241,736

(22) Filed: Sep. 23, 2011

(65) Prior Publication Data
US 2012/0074990 A1 Mar. 29, 2012

(30) Foreign Application Priority Data

Sep. 24, 2010 (GB) .................................. 1016057.0

(51) Int. Cl.
H03L 7/00 (2006.01)
(52) U.S. Cl.
USPC ................... 331/18; 331/45; 331/47
(58) Field of Classification Search
USPC ............. 331/18, 45, 47, 55, 57; 327/156–158
See application file for complete search history.

(56) References Cited

U.S. PATENT DOCUMENTS

| 3,701,020 | A | 10/1972 | De Vito |
| 4,356,456 | A | 10/1982 | Uzunoglu |
| 6,188,291 | B1 | 2/2001 | Gopinathan et al. |
| 7,274,231 | B1 * | 9/2007 | Gillespie et al. ............. 327/158 |
| 2006/0152293 | A1 | 7/2006 | McCorquodale et al. |
| 2006/0214742 | A1 | 9/2006 | Dally et al. |
| 2009/0033430 | A1 * | 2/2009 | Jang et al. ......................... 331/57 |
| 2009/0072913 | A1 * | 3/2009 | Eikenbroek ..................... 331/18 |
| 2009/0081961 | A1 | 3/2009 | Rofougaran |
| 2009/0129524 | A1 * | 5/2009 | Chen et al. .................... 375/376 |
| 2009/0175116 | A1 | 7/2009 | Song et al. |
| 2010/0052797 | A1 * | 3/2010 | Carley et al. .................... 331/18 |
| 2010/0085123 | A1 * | 4/2010 | Frans et al. ..................... 331/47 |

FOREIGN PATENT DOCUMENTS

WO 2008/041222 4/2008

OTHER PUBLICATIONS

UK Search Report dated Jan. 6, 2012, in corresponding GB application GB1016057.0.
Extended European Search Report dated Jul. 12, 2012, in corresponding European application.

* cited by examiner

Primary Examiner — Joseph Chang
Assistant Examiner — Jeffrey Shin
(74) Attorney, Agent, or Firm — Novak Druce Connolly Bove + Quigg LLP; Vincent M DeLuca

(57) ABSTRACT

A signal generator for generating an output signal with a frequency that is a multiple of a frequency of a reference signal, the signal generator including an oscillator configured to generate the output signal in dependence on the reference signal and a control signal and a control circuit configured to generate the control signal to comprise a series of pulses in which one or more of the pulses is offset in phase relative to the reference signal, the control circuit thereby being capable of controlling the frequency and/or phase of the output signal.

22 Claims, 3 Drawing Sheets

INJECTION-LOCKED OSCILLATOR

BACKGROUND OF THE INVENTION

The invention relates to an injection-locked oscillator and, in particular, to an injection-locked oscillator that utilises a pulse generator to maintain a phase-alignment between a reference signal and the signal output by the oscillator.

A phase-locked loop is a well known circuit for generating signals having a predetermined frequency relationship with a reference signal. In its most basic form, a phase-locked loop comprises an oscillator that is controlled by means of a feedback loop. The feedback loop takes the output of the oscillator, compares it with a reference signal and adjusts the oscillator accordingly. Typically the feedback loop comprises a divider for dividing the output signal, a phase comparator for comparing the phase of the divided signal with the reference signal and a charge pump for outputting a pulse of charge that either speeds up or slows down the oscillator, in dependence on the phase comparison. The phase-locked loop will also typically include a filter for removing spurious noise from the charge pulse before it reaches the oscillator input.

By incorporating a divider into the feedback loop, the phase-locked loop is able to output frequencies that are an integer multiple of the reference signal. Some phase-locked loops are able to output signals that are non-integer multiples of the reference signal. These phase-locked loops are known as "frac-N" phase-locked loops. Frac-N phase-locked loops comprise a fractional divider in the feedback loop. The fractional divider divides the output signal by a varying integer to achieve an output signal that is a non-integer multiple of the reference signal.

Although phase-locked loops are effective at generating signals having a wide range of different frequencies from a single frequency reference, they are not always suitable for low-power implementations. The phase comparator and the divider tend to be particularly power-hungry. Therefore, for some implementations it is preferred to use a different way of generating signals, such as injection locking.

Injection locking is a physical phenomenon whereby an oscillator synchronises with an external periodic signal when the frequency of that signal is sufficiently close to the natural frequency of the oscillator or one of the harmonics of that natural frequency. Suppose a signal of frequency $\omega_i$ is injected into an oscillator having a free-running frequency of $\omega_0$. When $\omega_i$ and $\omega_0$ are quite different, the oscillator outputs a signal containing beats of the two frequencies. However, as $\omega_i$ approaches $\omega_0$ the beat frequency decreases until, as $\omega_i$ enters what is known as the "locking range", the beats disappear and the oscillator starts to oscillate at $\omega_i$. Injection locking also happens when $\omega_i$ is close to a harmonic or sub-harmonic of $\omega_0$, i.e. $n\omega_0$ or $1/n\, \omega_0$. Locking the oscillator to a harmonic of $\omega_0$ can be used for frequency division while locking the oscillator to a sub-harmonic of $\omega_0$ can be used for frequency multiplication.

In one implementation of an injection-locked oscillator a stream of narrow pulses is injected into the oscillator. This is shown generally in FIG. 1. The pulses may help to keep the oscillator synchronised with the injection frequency by periodically shorting the tank of the oscillator. An example of such a circuit is shown in FIG. 2, which shows a pulse generator 201 connected to an oscillator 202, which is in turn connected to an output buffer 203. The stream of pulses generated by the pulse generator control a switch 204 that shorts the capacitor bank of the oscillator when the pulse goes high. The pulse train frequency is set to a multiple or sub-multiple of the desired frequency, depending on whether frequency division or multiplication is required. The width of the pulses should preferably be set to be much less than the period of oscillation of the reference signal so that the quality factor Q of the tank is not too severely degraded.

FIG. 3 shows examples of the signals involved. The reference signal is shown at 301 with the stream of pulses output by the pulse generator shown at 302. As shown in the figure, each pulse corresponds to a rising edge of the reference signal. If the pulse occurs at the zero crossing of the oscillator signal (signal 305) it will have no effect on the output (assuming that the pulse is very narrow). If the shorting occurs either before or after the zero crossing of the oscillator signal, the oscillator signal is pushed towards the zero crossing point of the reference signal so that its own phase is either delayed (signal 303) or advanced (signal 304). The effect of the pulse is therefore to increase the frequency of the oscillator signal if it is late relative to the reference signal and to decrease the frequency of the oscillator signal if it is early relative to the reference signal. This periodic phase-shifting causes the average frequency of the oscillator to match the desired frequency.

Injection-locked oscillators are a compact, low power and elegant solution to replace a phase-locked loop. However, injection-locked oscillators have some major drawbacks because, by definition, if the oscillator signal is injection-locked to the reference signal it means that the phase of the oscillator signal sampled at the rising edge of the reference signal is constant. Therefore, the injection-locked oscillator is not capable of non-integer frequency multiplication or phase modulation.

Therefore, there is a need for an improved oscillator that combines the advantages of an injection-locked oscillator with the capability to perform non-integer frequency multiplication and phase modulation.

SUMMARY OF THE INVENTION

According to a first embodiment of the invention, there is provided a signal generator for generating an output signal with a frequency that is a multiple of a frequency of a reference signal, the signal generator comprising an oscillator configured to generate the output signal in dependence on the reference signal and a control signal and a control circuit configured to generate the control signal to comprise a series of pulses in which one or more of the pulses is offset in phase relative to the reference signal, the control circuit thereby being capable of controlling the frequency and/or phase of the output signal.

The control circuit may be arranged to control the phase of the output signal to be offset from the reference signal by controlling the phase of each of the pulses to be offset from the reference signal.

The control circuit may be arranged to control the frequency of the output signal to be a non-integer multiple of the frequency of the reference signal by controlling the phase of each pulse such that, for a predetermined number of periods of the reference signal, the phase offset between each pulse and the reference signal progressively increases from one period of the reference signal to the next.

The control circuit may be arranged to control the non-integer multiple to comprise an integer part and a fractional part, the control circuit being arranged to control the phase of the pulses so that the phase difference between each pulse and the reference signal progressively increases by a multiple of the fractional part of the non-integer multiple and the period of the output signal from one period of the reference signal to the next.

The control circuit may be arranged to input at least one pulse into the oscillator during each period of the reference signal.

The control circuit may comprise a delay line arranged to delay the reference signal to generate a delayed reference signal, the control circuit being configured to generate the series of pulses in dependence on the delayed reference signal.

The control circuit may be arranged to control the phase of each pulse relative to the reference signal by controlling the delay applied to the reference signal by the delay line.

The delay line may be arranged to delay the reference signal in dependence on a delay control signal.

The control circuit may be arranged to generate the delay control signal such that, for a predetermined number of periods of the reference signal, the delay control signal has a continuously increasing magnitude.

The control circuit may be arranged to generate the delay control signal such that it has the form of a sawtooth wave.

The control circuit may be arranged to generate the delay control circuit to have a frequency equal to a multiple of the frequency of the reference signal and the fractional part of the non-integer multiple.

The control circuit may comprise a pulse generator arranged to receive the delayed reference signal and generate the series of pulses in dependence on the delayed reference signal.

The control circuit may comprise an input for receiving a frequency division command and an integrator configured to integrate the frequency division command to form a frequency division signal.

The control circuit may comprise an input for receiving a phase modulation command and a summation unit arranged to sum the phase modulation command with the frequency division signal.

The control circuit may comprise an amplifier arranged to amplify the output of the summation unit, the control circuit being arranged to control the delay applied by the delay line in dependence on the output of the amplifier.

The amplifier may be a digital multiplier

The control circuit may comprise a digital-to-analogue converter arranged to receive the output of the multiplier and form the delay control signal by converting the output of the multiplier into the analogue domain.

The oscillator may comprise a resonator for generating an oscillating signal and a switch arranged to receive the series of pulses and to, when a pulse is received, short the resonator for the duration of that pulse.

BRIEF DESCRIPTION OF THE DRAWINGS

For a better understanding of the present invention, reference is made by way of example to the following drawings, in which.

DETAILED DESCRIPTION OF THE INVENTION

A signal generator for generating an output signal having a frequency that is a multiple of a frequency of a reference signal may include an oscillator and a control circuit. The oscillator is suitably configured to receive the reference signal. The control circuit is suitably configured to input a series of pulses into the oscillator. The oscillator may then generate an output signal in dependence on both the reference signal and the series of pulses. Preferably the control circuit controls the phase of each pulse so that one or more of the pulses is offset in phase relative to the reference signal. Advantageously, controlling the phase of the pulses may enable the control circuit to control the frequency and/or phase of the signal output by the oscillator.

Figure 1:
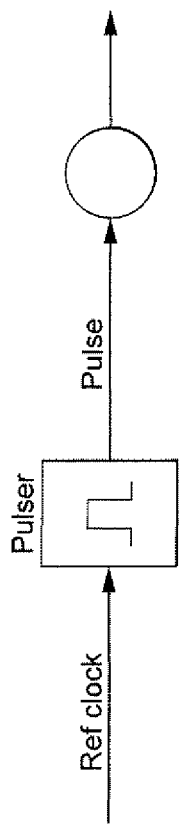
FIG. 1 shows a pulse generator arranged to input a stream of pulses into an oscillator.
Figure 3:
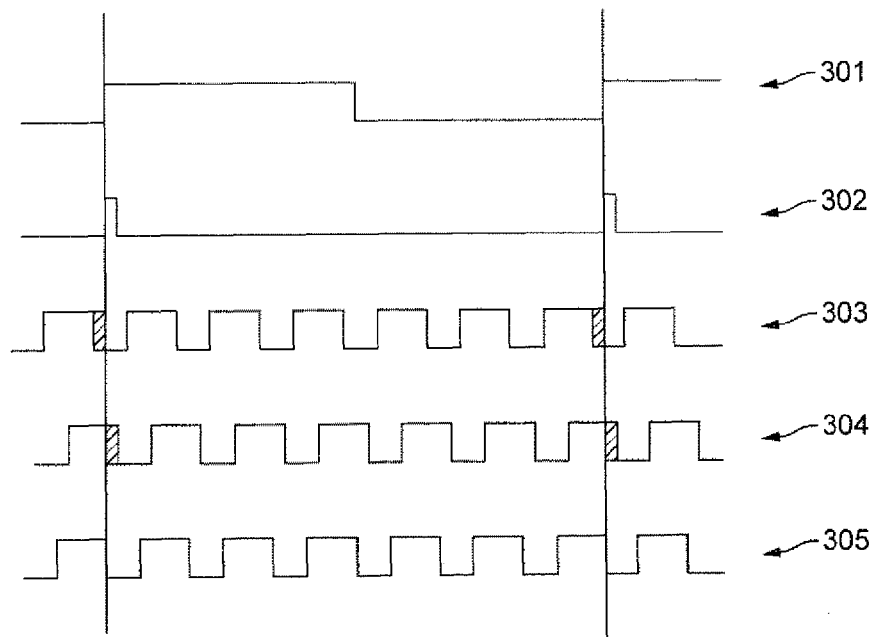
FIG. 3 shows a series of signals that may be generated by a delay line and an oscillator.
Figure 4:
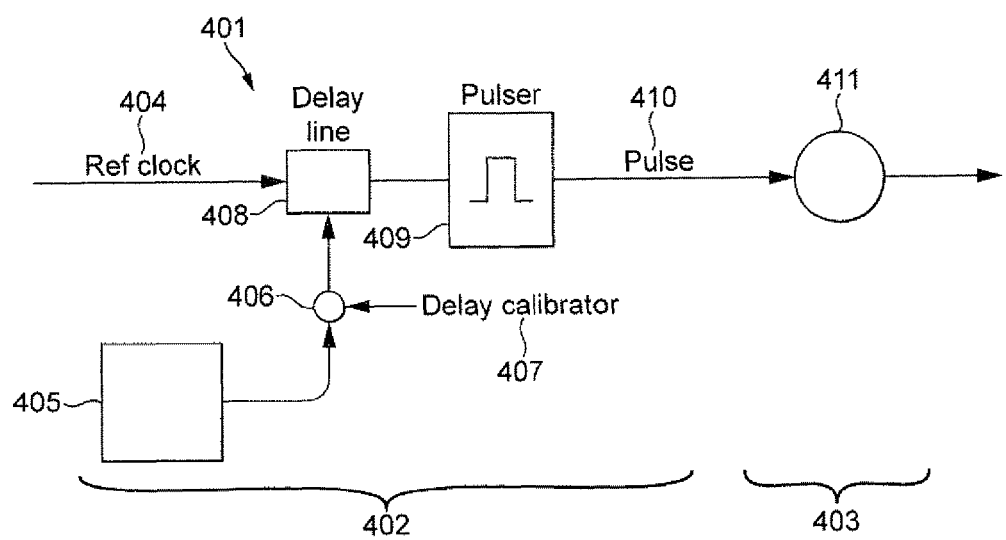
FIG. 4 shows a signal generator according to an embodiment of the invention.

An example of a signal generator that is arranged to control the frequency and/or phase of an output signal is shown in FIG. 4. The signal generator is shown generally at 401 and comprises a control circuit 402 and an oscillator 403. The control circuit comprises a pulse generator 409 for generating a series of pulses 410 to be input into the oscillator. The control circuit is configured to control the phase of the pulses being input into the oscillator relative to the reference signal so that rather than each pulse occurring on the rising edge of the reference signal (such as in the circuits shown in FIGS. 1 to 3), at least some of the pulses are offset in phase relative to the reference signal.

Once locked, the phase of the oscillator will simply track the phase of the pulses input into the oscillator. Therefore, the phase and frequency of the oscillator output may be arbitrarily modulated by changing the phase of those pulses from one time period to the next. This allows the control circuit to control the oscillator output to be a non-integer multiple of the reference signal and/or offset in phase relative to the reference signal.

The stream of pulses input into the oscillator preferably causes the oscillator frequency to increase if it is late compared with the delayed reference signal and to decrease if it is early compared with the delayed reference signal. The effect of delaying the reference signal is to cause the oscillator to speed up/slow down to a frequency that is not a harmonic of the reference signal. For example, the oscillator might be tuned to have a natural frequency that is approximately four times the frequency of the reference signal so that the oscillator would lock onto the fourth harmonic. By progressively delaying the reference signal, the oscillator signal can be made to appear either closer in phase to the reference signal or further away in phase from the reference signal than it really is. As a result, the stream of pulses generated from the progressively delayed reference signal can cause the oscillator to speed up/slow down to a greater or lesser extent than it would if pulses were in phase with the reference signal. A consequence of this is that the oscillator signal can be made to have a frequency that is a non-integer multiple of the reference frequency. For example, the oscillator might be controlled by the stream of pulses to output a signal having a frequency 4.25 times the frequency of the reference signal.

Once the oscillator is locked the phase of the oscillator tracks the phase of the pulses. Phase modulation may therefore be achieved by generating the pulses so that they incorporate a modulated or permanent offset relative to the reference signal. Such a phase offset may be superimposed on an offset applied to control the frequency of the output signal to achieve an oscillator output that is both a non-integer multiple of the reference frequency and offset in phase relative to the reference signal.

Figure 2:
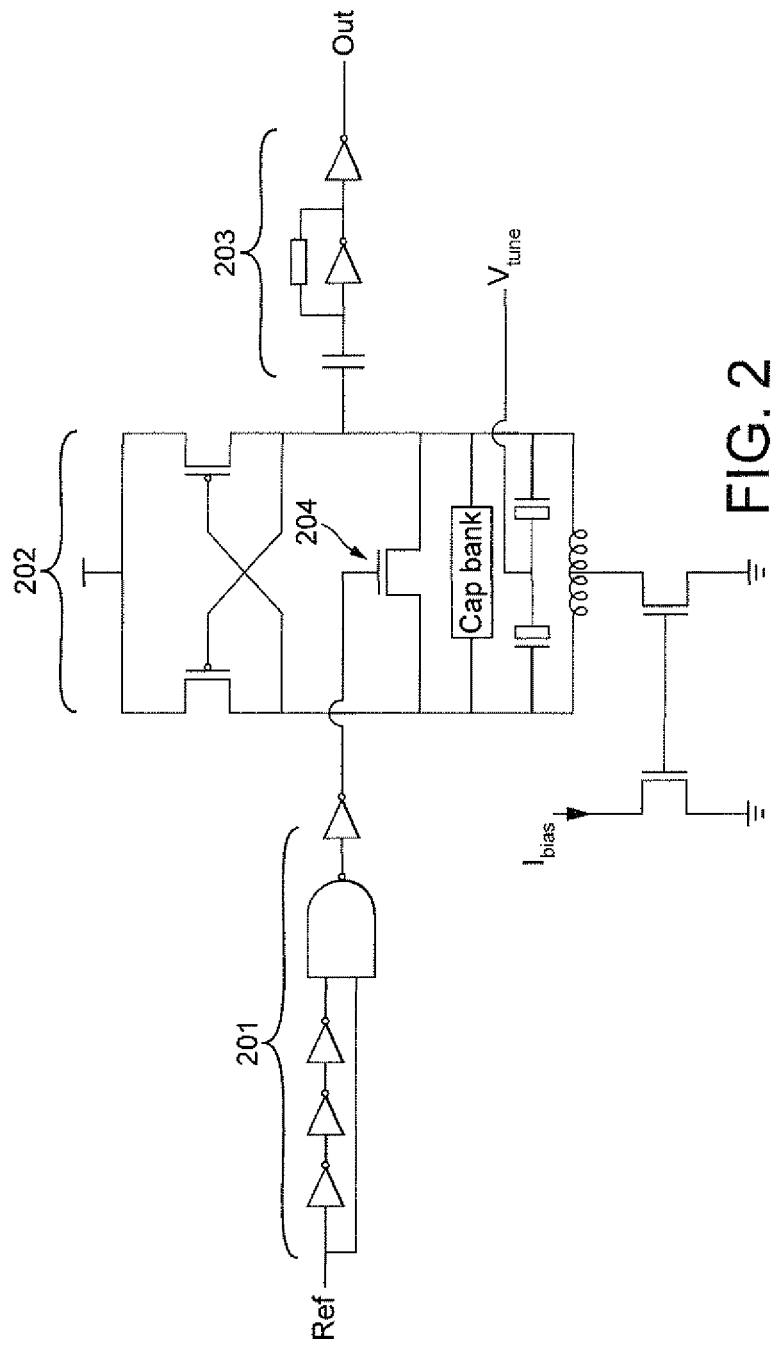
FIG. 2 shows a delay line for generating a stream of pulses and an oscillator for receiving those pulses.

The oscillator may be arranged similarly to the oscillator shown in FIG. 2, so that the input stream of pulses shorts the resonator, thereby affecting the phase and frequency of the output. This is only one example. Other possible implementations include using the input stream to modulate a varactor and injecting the pulses with opposite phases on the two sides of the oscillator.

The stream of pulses suitably comprises one pulse per period of the reference signal. The pulse generator may therefore be configured to use the reference signal to generate the stream of pulses. The control circuit may be configured to apply a delay to the reference signal before it enters the pulse generator in order to modulate the phase of the resulting pulses. The control circuit may therefore comprise a delay line 408 that receives the reference signal 404 and delays it in dependence on a delay control signal 412. The delay line may suitably be digitally controlled so that it introduces minimal complexity into the signal generator. The range of the delay line should preferably be at least one period of the oscillator to enable the full-range of phase modulation.

The pulse generator may suitably generate a narrow pulse on each rising edge of the delayed reference signal. The stream of pulses output by the pulse generator may therefore comprise one pulse per period of the reference signal. Each pulse may be aligned with the rising edge of the delayed reference signal rather than the reference signal itself. An example of such a pulse generator is, for example, pulse generator 201 shown in FIG. 2. The pulses can be of any width. For some implementations, however, it may be preferable for each pulse to be narrower than one period of the oscillator output, depending on how the injection is performed. For other implementations, for example, implementations in which the oscillator is only sensitive to the pulse edges, it is not a requirement for the pulses to be short.

The delay control signal that controls the delay line may comprise one or both of a phase component and a frequency component. The phase component may be provided by a phase modulation command 407. This may be a digital signal that is input into a summation unit 406 for summing with the frequency division signal 413. The frequency division signal may be output by a frequency control block 405. Further details are shown in FIG. 5.

Figure 5:
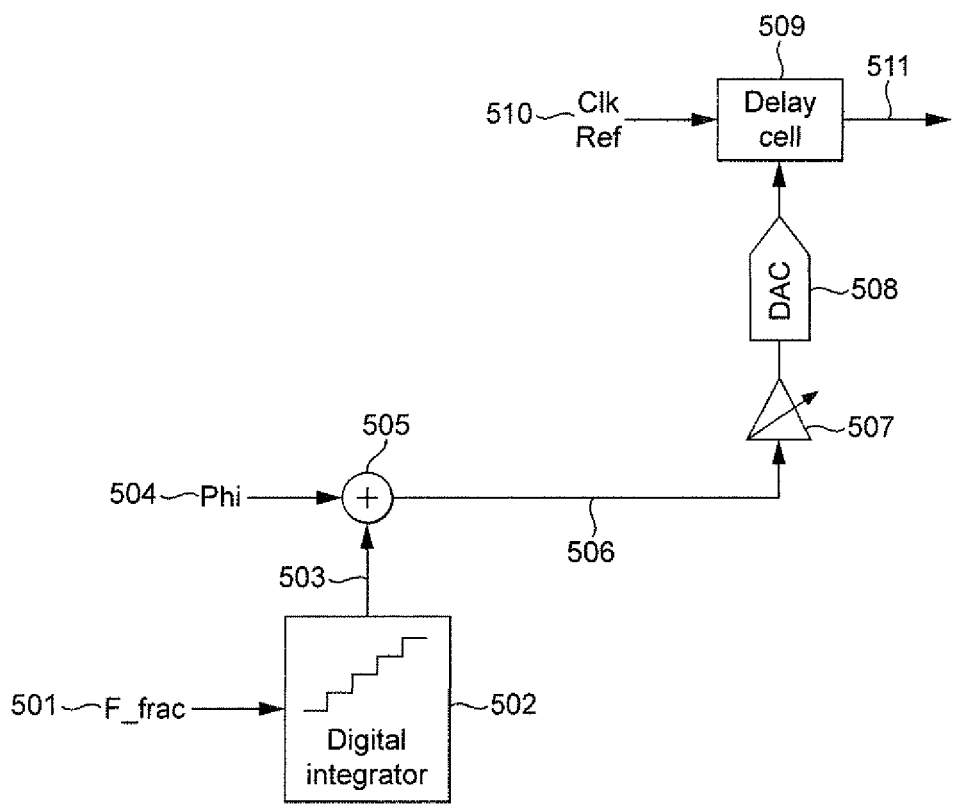
FIG. 5 shows delay circuitry according to an embodiment of the invention.

FIG. 5 shows an example of a circuit for generating the delay control signal. In FIG. 5 a frequency division command signal 501 is input into a digital integrator 502. The integrator integrates the frequency division command signal to generate the frequency division signal 503. The integrator may be of any suitable design. The frequency division signal is then passed to a summation unit 505, which sums it with the phase modulation command 504. If only one of frequency modulation or phase modulation is required, then the appropriate input may be set to zero so that the modulation control signal 506 effectively comprises only one of a frequency division signal or phase modulation command.

The output of adder 505 is a modulation signal which is amplified by variable amplifier 507. The output of variable amplifier 507 is converted to the analogue domain by digital-to-analogue converter (DAC) 508. The output of DAC 508 is input to the delay line 509 and sets the delay applied by the delay line. A filter or other means may be inserted between DAC 508 and the delay line so that the delay line is controlled appropriately in dependence on the output of the DAC.

A signal generator such as that described above can be used in many different ways. One particularly advantageous implementation uses the signal generator to generate an output signal that is a non-integer multiple of the reference signal. This may be achieved by applying a ramp to the control port of the delay line. When the ramp reaches a magnitude corresponding to the maximum delay achievable by the delay line, the ramp preferably "jumps" back to a minimum magnitude so that the delay applied by the delay line jumps by one oscillator period. The signal at the control port of the delay line thus has the form of a saw-tooth waveform. Such a waveform can be generated, for example, by inputting a signal of a constant, non-zero magnitude into the integrator 502 shown in FIG. 5.

Applying a ramp to the control input of the delay line causes the reference signal to be increasingly delayed until the ramp jumps back to its minimum magnitude. The reference signal is therefore subject to a steadily increasing delay that reaches one period of the oscillator output before jumping back one oscillator period. When the delay jumps back one oscillator period, the reference signal is for a short time subject to zero delay before the delay gradually increases once more. The effect of this gradually increasing delay is to generate a stream of pulses in which the pulse occurs later and later relative to the rising edge of the reference signal until (after it has been delayed for one period of the oscillator signal) it jumps back to coinciding with the rising edge of the reference signal.

The non-integer multiple is dependent on the frequency of the ramp. Generally, if the required frequency of the output signal is N*Ref+fracN (with Ref being the frequency of the reference signal), then the frequency of the ramp should be fracN. As an example, if the required multiple is n+0.25 (so that the frequency of the output signal is (n+0.25)*Ref), each pulse should be delayed by an additional 0.25 of an oscillator period from the preceding pulse. The period of the ramp should correspondingly be four times the period of the reference signal.

A phase offset may be achieved simply by inputting a signal of a constant, non-zero magnitude into the summation unit 505 shown in FIG. 5.

The frequency of the oscillator output is not dependent on the peak-to-peak excursion in the delay applied to the reference signal. The peak-to-peak excursion is preferably adjusted to be exactly one period of the oscillator output. In order to achieve this, a calibration operation may be performed at start-up to obtain the delay corresponding to one period of the oscillator output. This calibration may be performed using a flip-flop detector that samples the oscillator output on the rising edge of the delayed reference signal. The calibration is suitably initiated by setting the free-running frequency of the oscillator to the desired running frequency. The injection mechanism is disabled. The reference signal is then repeatedly delayed by the minimum delay of which the delay line is capable (delay 0) every even clock cycle and by a predetermined delay every odd clock cycle (delay N). The flip-flop can be considered an early-late detector. If the oscillator is late compared with the delayed reference signal, the flip-flop outputs −1, whereas if the oscillator is early compared with the reference signal, the flip-flop outputs+1. Detector (0)*Detector (N) is then integrated over successive cycles, i.e. a correlation operation is performed on the flip-flop output. The correlation is a maximum when delay N is exactly one period of the free-running oscillator. So the delay N that produces the maximum correlation is also equal to one period of the free-running oscillator output. Providing the free-running oscillator frequency is close enough to the desired frequency, the delay N can then be used to set the maximum delay of the delay line for operation of the oscillator.

One or more embodiments of the invention therefore provide a signal generator that is capable of producing a signal having a frequency that is a non-integer multiple of a reference signal, and which is capable of achieving an arbitrary phase modulation of the reference signal, in a similar way to a fractional-N PLL but without having to power a phase comparator, charge pump, divider etc. The only component remaining from a traditional PLL is the oscillator. Although the signal generator described above adds a delay line to the oscillator, the current consumption (and therefore power consumption) of the delay line is low. The signal generator according to embodiments of the invention has therefore much lower power consumption than a traditional PLL. In addition, the signal generator according to embodiments of the invention is able to achieve lock across a wide bandwidth, which means that the signal generator has a very short lock time. This has the result that the power required to achieve lock is also very low.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The invention claimed is:

1. A signal generator for generating an output signal with a frequency that is a multiple of a frequency of a reference signal, the signal generator comprising:
   an oscillator configured to generate the output signal in dependence on the reference signal and a control signal; and
   a control circuit configured to generate the control signal to comprise a series of pulses in which one or more of the pulses is offset in phase relative to the reference signal, the control circuit being arranged to control the frequency of the output signal to be a non-integer multiple of the frequency of the reference signal by controlling the phase of each pulse such that for a predetermined number of periods of the reference signal, a phase offset between each pulse and the reference signal increases progressively from one period of the reference signal to the next.

2. A signal generator as claimed in claim 1, wherein the control circuit is arranged to control the phase of the output signal to be offset from the reference signal by controlling the phase of each of the pulses to be offset from the reference signal.

3. A signal generator as claimed in claim 1, wherein the control circuit is arranged to control the non-integer multiple to comprise an integer part and a fractional part, the control circuit being arranged to control the phase of the pulses so that the phase difference between each pulse and the reference signal is progressively incremented by the product of the fractional part and the period of the output signal.

4. A signal generator as claimed in claim 1, wherein the control circuit is arranged to input at least one pulse into the oscillator during each period of the reference signal.

5. A signal generator as claimed in claim 1, wherein the control circuit comprises a delay line arranged to delay the reference signal to generate a delayed reference signal, the control circuit being arranged to generate the series of pulses in dependence on the delayed reference signal.

6. A signal generator as claimed in claim 5, wherein the control circuit is arranged to control the phase of each pulse relative to the reference signal by controlling the delay applied to the reference signal by the delay line.

7. A signal generator as claimed in claim 5, wherein the delay line is arranged to delay the reference signal in dependence on a delay control signal.

8. A signal generator as claimed in claim 6, wherein the control circuit is arranged to generate the delay control signal such that, for a predetermined number of periods of the reference signal, the delay control signal has a continuously increasing magnitude.

9. A signal generator as claimed in claim 7, wherein the control circuit is arranged to generate the delay control signal such that it has the form of a sawtooth wave.

10. A signal generator as claimed in claim 8, wherein the control circuit is arranged to control the non-integer multiple to comprise an integer part and a fractional part, the control circuit being arranged to control the phase of the pulses so that the phase difference between each pulse and the reference signal is progressively incremented by the product of the fractional part and the period of the output signal; and
    wherein the control circuit is arranged to generate the delay control signal to have a frequency equal to a multiple of the frequency of the reference signal and the fractional part of the non-integer multiple.

11. A signal generator as claimed in claim 5, wherein the control circuit comprises a pulse generator arranged to receive the delayed reference signal and generate the series of pulses in dependence on the delayed reference signal.

12. A signal generator as claimed in claim 1, wherein the control circuit comprises an input for receiving a frequency division command and an integrator arranged to integrate the frequency division command to form a frequency division signal.

13. A signal generator as claimed in claim 12, wherein the control circuit comprises an input for receiving a phase modulation command and a summation unit arranged to sum the phase modulation command with the frequency division signal.

14. A signal generator as claimed in claim 13, wherein the control circuit comprises an amplifier arranged to amplify the output of the summation unit, the control circuit being arranged to control the delay applied by the delay line in dependence on the output of the amplifier.

15. A signal generator as claimed in claim 14, wherein the amplifier is a digital multiplier.

16. A signal generator as claimed in claim 14, wherein the control circuit comprises a digital-to-analogue converter arranged to receive the output of the amplifier and form the delay control signal by converting the output of the amplifier into the analogue domain.

17. A signal generator as claimed in claim 1, wherein the oscillator comprises:
    a resonator for generating an oscillating signal; and
    a switch arranged to receive the series of pulses and to, when a pulse is received, short the resonator for the duration of that pulse.

18. A radio transmitter or receiver comprising a signal generator as claimed in claim 1.

19. A signal generator for generating an output signal with a frequency that is a multiple of a frequency of a reference signal, the signal generator comprising:
    an oscillator configured to generate the output signal in dependence on the reference signal and a control signal; and
    a control circuit configured to generate the control signal to comprise a series of pulses in which one or more of the pulses is offset in phase relative to the reference signal, the control circuit thereby being arranged to control the frequency and/or phase of the output signal;

wherein the control circuit comprises an input for receiving a frequency division command and an integrator arranged to integrate the frequency division command to form a frequency division signal, and wherein the control circuit comprises an input for receiving a phase modulation command and a summation unit arranged to sum the phase modulation command with the frequency division signal.

20. A signal generator as claimed in claim 19, wherein the control circuit comprises an amplifier arranged to amplify the output of the summation unit, the control circuit being arranged to control the delay applied by the delay line in dependence on the output of the amplifier.

21. A signal generator as claimed in claim 20, wherein the amplifier is a digital multiplier.

22. A signal generator as claimed in claim 20, wherein the control circuit comprises a digital-to-analogue converter arranged to receive the output of the amplifier and form the delay control signal by converting the output of the amplifier into the analogue domain.

* * * * *